United States Patent [19]
Guild

[11] 4,247,623
[45] Jan. 27, 1981

[54] BLANK BEAM LEADS FOR IC CHIP BONDING

[75] Inventor: John R. Guild, Rochester, N.Y.

[73] Assignee: Eastman Kodak Company, Rochester, N.Y.

[21] Appl. No.: 49,662

[22] Filed: Jun. 18, 1979

[51] Int. Cl.³ .............................................. G03C 1/94
[52] U.S. Cl. ............................ 430/275; 228/180 A;
430/277; 430/281; 430/288; 430/312; 430/326;
430/502; 430/910; 430/952
[58] Field of Search .................. 228/180 A; 430/275,
430/277, 281, 288, 312, 502, 910, 952, 326

[56] References Cited

U.S. PATENT DOCUMENTS

| | | | |
|---|---|---|---|
| 3,203,801 | 8/1965 | Heiart | 96/87 |
| 3,252,800 | 5/1966 | Smith | 96/115 |
| 3,682,641 | 8/1972 | Casler et al. | 96/35.1 |
| 3,758,396 | 9/1973 | Roos | 96/83 |
| 3,763,804 | 10/1973 | Airn | 317/234 R |
| 3,795,043 | 3/1974 | Fortani | 96/36 |
| 3,804,631 | 4/1974 | Faust | 96/87 R |
| 3,960,572 | 6/1976 | Ibata et al. | 96/115 R |
| 4,054,479 | 10/1977 | Peiffer | 96/35.1 |
| 4,079,509 | 3/1978 | Jackson et al. | 228/180 A |

FOREIGN PATENT DOCUMENTS 1321108  6/1973  United Kingdom.
1507704  4/1978  United Kingdom.
1513149  6/1978  United Kingdom.

OTHER PUBLICATIONS

Grossman, *Electronics*, 5/16/74, pp. 89–95.

*Primary Examiner*—Jack P. Brammer
*Attorney, Agent, or Firm*—D. M. Schmidt

[57] ABSTRACT

A three-layer blank and a process are disclosed for the formation of frames of metal beam leads that are bonded to integrated circuit chips. The blank incorporates an improved negative-working resist having adhesion to the metal as well as flexibility. The process of forming the leads includes the step of fully photopolymerizing the resist to avoid outgassing of residual monomer as would otherwise occur during bonding.

5 Claims, 3 Drawing Figures

BLANK BEAM LEADS FOR IC CHIP BONDING

FIELD OF THE INVENTION

This invention relates to a multilayer "blank" for multiple beam leads that can be simultaneously bonded to an integrated (IC) chip preferably by automated equipment. In particular, the invention relates to a blank featuring separate positive- and negative-working resist compositions and a method of preparing and bonding the aforementioned beam leads to IC chips.

BACKGROUND OF THE INVENTION

One of the most costly aspects of IC technology is the labor required to bond the IC chip to the rest of the circuit. Originally this was done by wire-bonding, which required the manual soldering of a wire under a microscope, first to the microscopically small chip and then to the rest of the circuit, one bond at a time. This is not a feasible long-term solution, as the number of bonds necessary would soon far exceed the number of laborers available.

One solution to this problem was to use a gang-bonding technique, wherein automatic bonding of a film-carrying frame to the IC chip or component avoids the necessity of wire bonding. As described in the May 16, 1974 issue of *Electronics,* page 89, such a technique uses a roll of film that carries to a bonding station a plurality of frames each of which has many generally planar microscopic, spider-shaped copper fingers known as leads. At the bonding station the inner portions of the leads are aligned and then simultaneously connected to the bonding sites on the IC chip. The outer portion of the leads is then available for bonding to remaining portions of the IC package.

Conventionally, such leads are themselves premanufactured, preferably by a photoresist etch process. Generally, such etching has been applied to a three-layer blank, comprising a layer of electrically conductive metal such as copper and a layer of photoresist on each side of the metal. At first both resists were positive-working, usually comprising a quinone diazide. The result of such a blank is a lead frame that lacks any means for maintaining the alignment of the etched leads. That is, the blank provided no means for supporting the etched leads because both resists of the blank were used for etching the leads.

Others suggested that a supporting plastic of the 3-layer blank should be formed to support the etched fingers or leads prior to bonding, as described for example in U.S. Pat. Nos. 3,795,043, issued Mar. 5, 1974 and 3,763,404, issued Oct. 2, 1973. The one layer of the blank that becomes the supporting plastic can be a negative-working resist. A typical negative-working composition has been "Riston", a photoresist material available under the noted trademark from DuPont.

One difficulty with such "supported plastic" blanks has been that, under certain exposure conditions, a large amount, e.g., from 10 to 50 weight percent, of the monomer of the negative resist can be left unpolymerized in the exposed areas. This has been found to be undesirable, because such monomer can leach out and have a corrosive influence on the finished product. Even if corrosive leaching is somehow avoided, residual monomer tends to outgas during the two separate steps of bonding the inner lead portions and the outer lead portions. Such outgassing is thought to be detrimental, particularly to the more expensive, high reliability IC components to be fabricated using the lead frames.

Therefore, it is desirable from the standpoint of electronic reliability that the residual monomers be eliminated. On the other hand, such elimination in effect removes a major plasticizer from the negative resist. This results in poor adhesion and brittleness that can completely negate the negative resist's function of supporting the leads prior to, during and after bonding of the IC chip. Thus, what has been needed is a negative resist formulation which, after substantially all residual monomers are removed from exposed areas, still retains sufficient adhesion to the metal and flexibility as will permit the blank to be coiled and uncoiled during the various process steps.

A large number of photoresist compositions are known in the art for generalized use. Many of these compositions are alleged to provide flexibility or improvement in some other respect, e.g., adhesion. Thus, British patent specification No. 1,507,704 discloses a photoresist composition including certain photopolymerizable monomers and a binder. However, there is no recognition by this patent of resist uses peculiar to the formation of beam leads for IC chips.

SUMMARY OF THE INVENTION

In accordance with the present invention, there is advantageously featured a blank containing a resist, capable of providing superior beam leads for automatic bonding of IC chips, and a process for forming such beam leads. The beam leads are maintained in their proper orientation prior to and during bonding by a spacer formed from the resist having superior adhesion to the beam leads.

In a related feature of the invention such a blank has sufficient flexibility to withstand multiple bending and flexing as is characteristic of the processing of such blanks.

The aforesaid features of the invention are achieved by the use of an improved blank having a structure comprising a flexible strip of electrically conductive metal, a layer of positive-working resist adhered to a portion of one surface of the metal strip, and a layer of negative-working resist adhered to a portion of the opposite surface of the metal strip. The improvement is that the negative-working resist comprises (a) a binder mixture of at least (i) a polymer having recurring units with the structure:

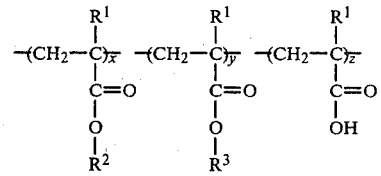

wherein each $R^1$ is independently hydrogen or methyl, $R^2$ is alkyl containing from about 3 to about 5 carbon atoms, $R^3$ is alkyl containing from 1 to about 2 carbon atoms, and x, y, and z are mole percents and are about $30 \leq x \leq 70$ $30 \leq y \leq 60$ $1 \leq z \leq 5;$ and (ii) poly(methyl methacrylate) hereinafter (PMMA) in an amount of from 0 to about 75 weight percent of the mixture; the binder mixture having a glass transition temperature (Tg) between about 50° and about 100° C.; (b) a photopolymerizable monomer selected from the group consisting of triethylene glycol diacrylate, tetraethylene glycol diacrylate; and a mixture of pentaerthyritol tetraacrylate and either 1,6-hexanediol diacrylate or tripropylene glycol diacrylate; and (c) a photoinitiator composition.

Such a blank permits the use of an improved process for the manufacture of frames containing beam leads suitable for bonding to an integrated circuit chip, the process comprising the steps of imagewise exposing and developing a positive-working resist on one side of a flexible, electrically conductive metallic layer to form a protective resist on the beam lead portions of the metallic layer, and a negative-working resist on the opposite side of the metallic layer to form a window-bearing spacer holding the beam leads in a desired orientation, etching through the exposed metallic layer to form the beam leads, inserting a chip into the spacer, and bonding the beam leads to the inserted chip. The improvement comprises exposing and developing the negative-working resist so that essentially all monomer in the exposed areas is fully polymerized prior to bonding of the IC chip, whereby outgassing of the negative-working resist during the bonding step is substantially reduced.

Other features of the invention will become apparent upon reference to the following Description of the Preferred Embodiments when read in light of the attached drawings.

DESCRIPTION OF THE PREFERRED EMBODIMENTS

Figure 1:
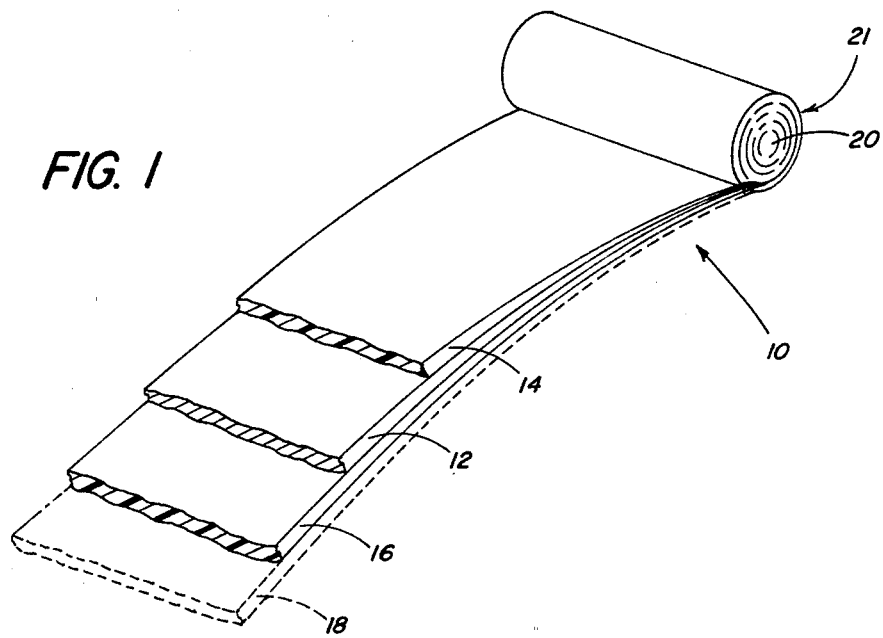
FIG. 1 is an isometric view of a blank prepared in accordance with the invention, the preferred form being a rolled-up strip or coating.

It has been discovered that conventional photoresist formulations cannot provide the exacting properties required for automated beam lead frame formation and bonding of IC chips. Specifically, manufacture of conventional electronic equipment such as circuit boards has not necessitated the kind of flexibility and strict dimensional controls that are needed in continuous strip processing of strip-form lead frames. Such continuous strip processing, generally described in the aforesaid U.S. Pat. No. 3,795,043, requires a blank in the form of a continuous strip to be unwound from a reel and fed intermittently through a photopolymerization exposure station, a developing station, and at least one etch bath, prior to the strip being recoiled for use in the subsequent bonding of an integrated circuit chip to the frame. The coiling and uncoiling during and after resist development subjects the strip to repeated flexures, during which the exposed and developed spacer resist for the leads must maintain its dimensional integrity to hold the leads in their proper orientation, i.e., space the leads within the plane of the strip.

Therefore, the invention is directed to a blank and process for the formation of an IC component lead frame which provide the above-noted properties.

The blank of the invention comprises a metallic layer or strip of metal, a layer of positive-working resist adhered to at least a portion of one surface of the metallic layer, and a negative-working resist layer adhered to at least a portion of the opposite surface of the metallic layer.

Any electrically conductive metallic layer can be used in the invention. Preferred are copper, silver and other similar metals, the materials that are favored for use as beam leads in bonding IC chips. Also, any positive-working resist capable of adhering to the selected metallic layer can be used. The choice is not critical and conventional formulations are acceptable.

In accordance with one aspect of the invention, the negative resist layer is formulated to have superior flexibility and adhesion to the metal layer, particularly a layer of copper. Such a resist comprises a binder mixture (a) noted above, a monomer (b) noted above, and a photoinitiator composition.

Useful binders include those that are a mixture of at least polymers (a) (i) and (ii) noted above. Highly preferred examples of polymer (a) (i) include poly(butyl methacrylate-co-methyl methacrylate-co-acrylic acid), the mole percents of the recurring units being selected to provide, with a 25 to 50 weight percent of PMMA, a glass transition temperature of between 50° and 100° C. The currently preferred mole ratios of the terpolymer are (63:34:3) available from Rohm and Haas Co. under the trademark "Acryloid B48N".

Although the mole percents of the terpolymer can be varied as noted above, it has been found that polymers having no acrylic acid (z=0) tend to provide a resist having insufficient adhesion to the metallic beam leads. Therefore, such polymers provide inadequate maintenance of the orientation of the beam leads prior to and during bonding of the chip to the leads.

The currently preferred monomer of the class (b) noted above is tetraethyleneglycol diacrylate. Dimethacrylate monomers are believed to lack the flexibility necessary to the formation of a successful resist spacer for the beam leads.

With respect to the photoinitiator of the negative-working resist, any free-radical generating photoinitiator system can be used which initiates polymerization of the polymerizable monomer and does not subsequently terminate the polymerization. The free-radical generating system preferably has at least one component that has an active radiation absorption band with a molar extinction coefficient of at least about 50 within the range of about 340 to 700 nm, and preferably 340 to 500 nm. "Active radiation absorption band" means a band of radiation which is active to produce the free radicals necessary to initiate polymerization of the ethylenically unsaturated monomer. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include all those known in the art, for example those described in the aforedescribed British patent specification No. 1,507,704, including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Highly preferred as the photoinitiator is a mixture of a 3-ketocoumarin and an amine such as is described in the commonly owned U.S. application Ser. No. 049,661 filed on June 18, 1979 by Farid et al entitled "Photopolymerizable Compositions Featuring Novel Co-initiators". Representative amines include ethyl-p-dimethylaminobenzoate; other esters of p-dimethylaminobenzoic acid, e.g., n-butyl-p-dimethylaminobenzoate, phenethyl-p-dimethylaminobenzoate, 2-phthalimidoethyl-p-dimethylaminobenzoate, 2-methacryloylethyl-p-dimethylaminobenzoate, 1,5-pentyl di-(p-dimethylamino)benzoate; 4,4'-bis(dimethylamino)benzophenone; phenethyl and 1,5-pentyl esters of m-dimethylaminobenzoic acid; p-dimethylaminobenzaldehyde; 2-chloro-4-dimethylaminobenzaldehyde; p-dimethylaminoacetophenone; p-dimethylaminobenzyl alcohol; ethyl-(p-dimethylamino)-benzoyl acetate; p-N-piperidinoacetophenone; 4-dimethylamino benzoin; N,N-dimethyl-p-toluidine; N,N-diethyl-m-phenetidine; tribenzyl amine; dibenzylphenyl amine; N-methyl-N-phenylbenzyl amine; p-bromo-N,N-dimethylaniline; tridodecyl amine; 4,4',4''-methylidyne(N,N-dimethylaniline) (crystal violet, leuco base); 3-indoleacetic acid; and N-phenylglycine.

The coumarin associated with the amine can be one or more of, e.g., the following:
3-(2-benzofuroyl)-7-diethylaminocoumarin;
3-(2-benzofuroyl)-7-(1-pyrrolidinyl)coumarin;
7-dimethylamino-3-thenoylcoumarin;
3-benzoyl-7-diethylaminocoumarin;
3-(o-methoxybenzoyl)-diethylaminocoumarin;
3-(m-fluorosulfonyl)benzoyl-diethylaminocoumarin;
3-(p-dimethylaminobenzoyl)-diethylaminocoumarin;
3,3'-carbonylbis(5,7-di-n-propoxycoumarin);
3,3'-carbonylbis(7-diethylaminocoumarin);
3-benzoyl-7-methoxycoumarin;
3-(2-furoyl)-7-diethylaminocoumarin;
3-(p-dimethylaminobenzoyl)-7-diethylaminocoumarin;
3-(p-diethylaminostyrylcarbonyl)-diethylaminocoumarin;
3-(p-morpholinostyrylcarbonyl)-diethylaminocoumarin;
9-(7-diethylamino-3-coumarinoyl)-1,2,4,5-tetrahydro-3H, 6H, 10H [1]benzopyrano[9, 9a, 1-gh]quinolazine-10-one which has the structure

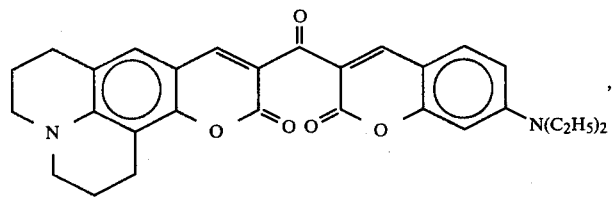

and
9-(7-n-propylamino-3-coumarinoyl)-2,4,5-tetrahydro 3H, 6H, 10H [1]benzopyrano[9, 9a, 1-gh]quinolazine-10-one It has been found that the noted coumarin-amine mixed photoinitiator renders objectionable outgassing of the remaining resist support less likely during bonding of the IC chip and/or during subsequent processing.

The weight percents of the components of the negative-working resist can be varied widely, based on the total weight of the solvent free composition. E.g., the monomer (b) noted above can be from about 20 to about 40 weight percent, and preferably from 24 to about 30. The photoinitiator composition can be from about 0.05 to about 10 weight percent, and preferably about 0.10 to about 5 weight percent (based on total solids).

Photoinhibitors are often desirable for use with the monomers, and conventionally a photoinhibitor such as hydroquinone is included in the monomers. If additional photoinhibitors are required, useful examples include 3-t-butyl-4-hydroxy-5-methylphenyl sulfide and t-butylpyrocatechol.

Stabilizers can also be added if desired, for example, benzotriazole.

With respect to the positive-working resist, because it is present only during the short time that is necessary to etch the metal to form the leads and provides no support function, as contrasted to the negative-working resist, formulation does not need to be carefully designed as to flexibility or adhesion. Thus, the positive-working resist can comprise, in general, any insoluble, light-sensitive material that becomes soluble in a solvent of choice when exposed, and an optional filler or binder such as a poly(acrylic acid) or a copolymer of ethyl acrylate and methacrylic acid. Particularly useful positive-working light-sensitive materials are cresol-formaldehyde resins condensed with quinone diazides to produce the structures

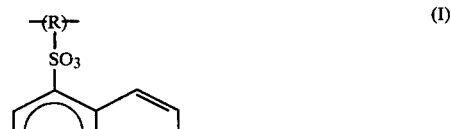 (I)

and

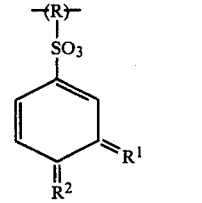 (II)

wherein R is the main chain of the cresol-formaldehyde resin and $R^1$ and $R^2$ are different and are either $N_2$ or O.

Such structures can be formed, for example, by condensing 6% of the resin with 6-diazo-5,6-dihydro-5-oxo-1-naphthalene sulfonyl chloride. Applicant's U.S. Pat. No. 4,141,733, issued Feb. 27, 1979, provides additional examples, the disclosure of which is hereby expressly incorporated by reference.

Alternatively, quinone diazides can be condensed with phenol- and cresol-formaldehyde novolak resins.

Stabilizers such as glacial acetic acid are often added to such positive-working resists.

The photochemistry by which a typical positive-working resin becomes soluble is believed to proceed as follows:

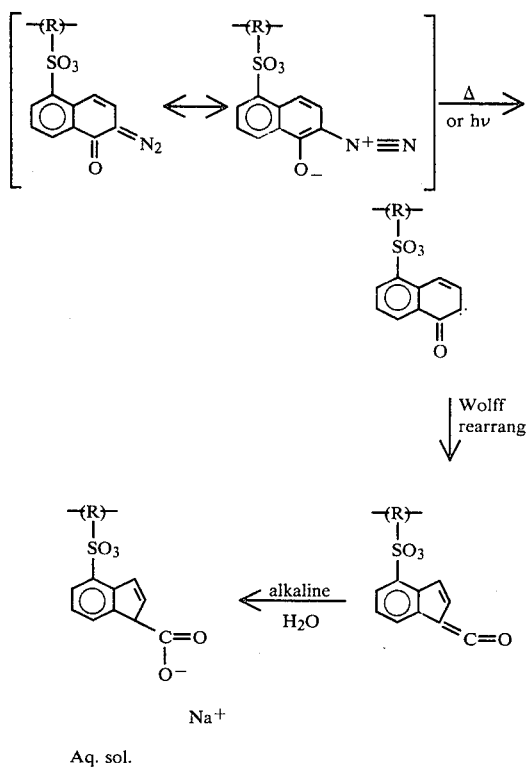

Aq. sol.

The dried negative-working resist layer has a thickness sufficient to provide the desired spacer function, preferably from 25 to about 75 microns. The dried positive-working resist is preferably from about 2.5 to about 5.0 microns thick, and the metallic layer from about 25 to about 75 microns thick, although other thicknesses outside these ranges may also be useful in certain applications.

The photoresists of the invention can be applied to the metal layer by a wide variety of techniques, including coating techniques such as spray-coating, whirl-coating, curtain-coating, roll-coating, and the like, all of which are conventional.

Any suitable solvent can be selected for preparing a coating of either resist on the metallic layer. Typical examples include dichloromethane, acetone, benzene, acetates, alcohols, ethers, toluene and the like. The choice will depend of course upon the composition selected for the resist.

Thus, as shown in FIG. 1, the blank 10 of the invention can comprise a metallic layer 12, a positive-working resist 14 and a negative-working resist 16. The negative resist can optionally include a removable cover sheet 18. Such a sheet is particularly useful for formulations of resist 16 that tend to be somewhat tacky or oxygen sensitive. The cover sheet can be either preformed and then laminated to layer 16, or it can be cast in place as a film from a water-soluble polymer. Examples of the former include cellulose esters such as cellulose triacetate, polyamides, polyolefins, vinyl polymers and polyesters. Examples of the latter include poly(vinyl alcohol) such as is obtainable from DuPont under the trade name "Alvinol 5105", or hydroxyalkyl cellulose of from 1–2 carbon atoms in the alkyl portion, as is available for example from Hercules Inc. under the trade name "Natrasol 180L".

The thickness of such cover sheets is not critical, other than that an excessive thickness makes removal more difficult. For example, a thickness of 12 to about 50 microns can be used. A preferred thickness is from about 17 to about 25 microns.

A preferred method of storage of the blank or tape of the invention, after manufacture, is in strip form coiled upon a suitable spool or mandrel 20 into a roll 21, FIG. 1. In such cases, the cover sheet or layer 18 is preferably one which prevents or bars transfer of monomer from layer 16 to layer 14 of the next adjacent section of the strip, at least in those instances in which the monomer is detrimental to the positive-working resist. Highly useful materials having such a barrier property include polyester films.

After the blank strip 10 is processed in the manner described hereinafter, there are formed in the blank, FIG. 2, successive frames 30 each of which comprises edge portion 31 of the metallic layer 12, etched to provide beam leads 36. Each of the leads has an inner portion 32 to be aligned with a selected portion of IC chip 40, and an outer lead portion 37 connected to edge portions 31. Portions 37 eventually are bonded to other electronic components. Sprocket holes 38 may also be formed in layer 12. The leads 36 are held in place prior to and during bonding of chip 40 by means of the exposed and developed negative resist layer 16, now in the general shape of an annular spacer 41 having a window 42. The inner dimensions of the window are sized to permit the insertion of chip 40. No positive resist remains.

Any suitable IC chip 40 can be used. For example, the IC chip 40 can be of a conventional type utilizing planar technology in which the chip is formed of a suitable semiconductor material such as silicon. The integrated circuit is formed by diffusing impurities into the silicon to form regions of opposite conductivity with junctions between the same extending to the planar upper surface of the silicon die. Contact buttons or "bumps", not shown, which make contact with the active regions of the devices of the integrated circuit are evaporated or deposited onto the dye by conventional methods. Beam leads 36 normally extend and are bonded to the contact bumps. As is well known to those skilled in the art, the integrated circuit can contain active and passive devices such as transistors, diodes, resistors and other electronic components to form at least part of an electrical circuit. The transistors can be of the n-p-n or p-n-p type.

As noted above, any tendency of the support resist to outgas during bonding can be harmful to the IC chip. Outgassing is preferably minimized by any or all of the following steps:

(a) the elimination of low-boiling plasticizers;

(b) the use of an amine-biscoumarin mixture as the photoinitiator in place of other initiators; and/or (c) the use of full photopolymerization exposure. As used herein, "full photopolymerization" means exposure and/or subsequent processing such as will completely polymerize the monomers of the negative-working resist, to prevent outgassing as is described in the "Background".

Figure 2:
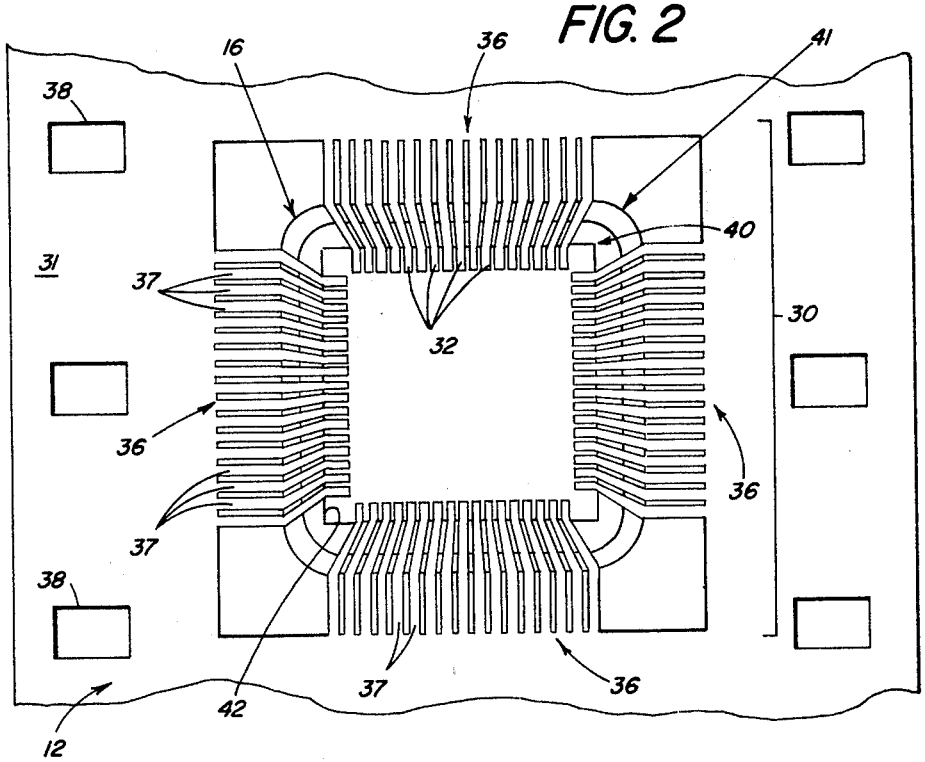
FIG. 2 is a fragmentary plan view of a single frame portion of the processed strip after the beam leads have been bonded to the IC chip and before it has been tested at a pre-test station, the details of the chip having been omitted for clarity.

A variety of processing steps, sequences and accompanying apparatus can be used to produce the bonded frames 30, FIG. 2, from the blank 10 of FIG. 1. For example, hand processing can be used. However, the commercial realities are that automated gang-bonding of all the leads in a single frame is necessary to render the process competitive.

Figure 3:
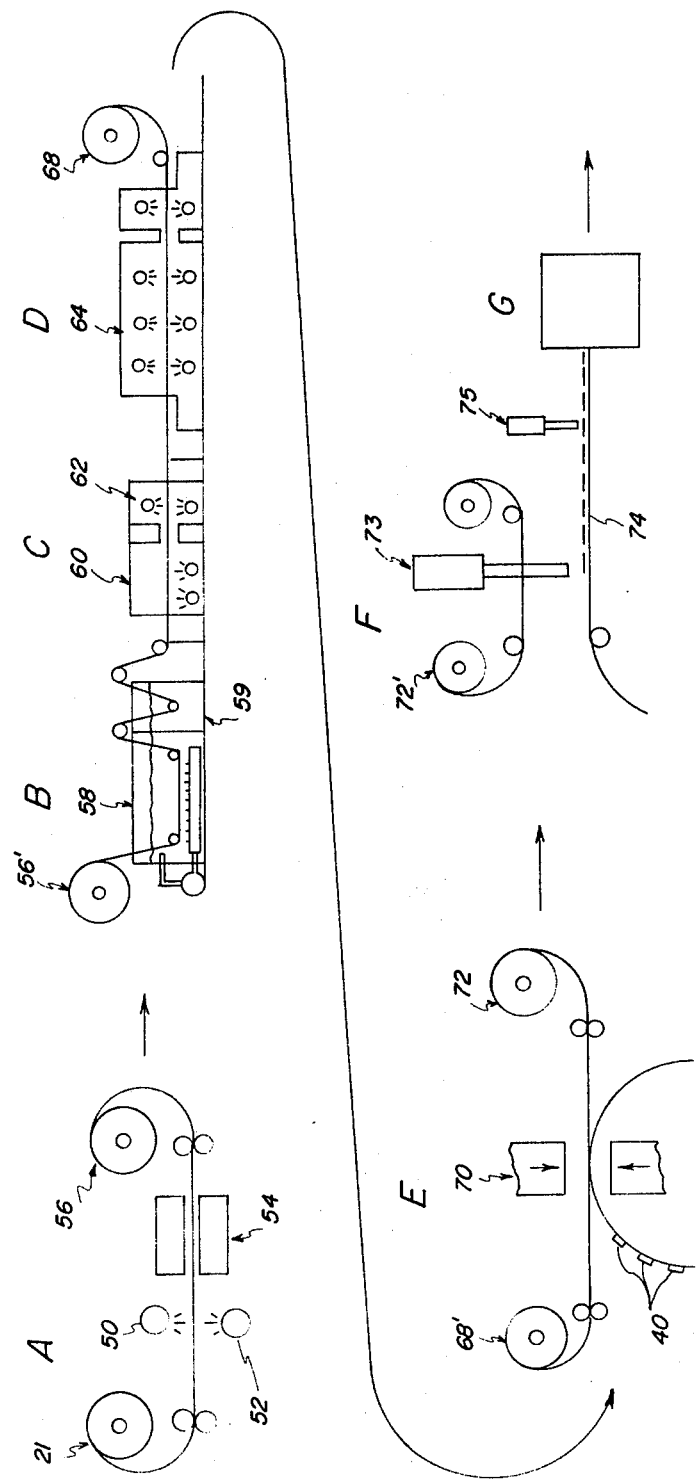
FIG. 3 is a schematic representation of the process and related apparatus used to convert the blank of the invention into lead frames assembled with IC chips.

A useful and preferred processing sequence is detailed in FIG. 3. At station A, a roll 21 of the blank is uncoiled and fed by conventional advancing means through exposure units 50 and 52. Unit 50 exposes the positive-working resist 14 through a suitable mask, not shown, which after development will leave resist in the unexposed areas that represent the beam leads 36, fingers 32 and edge portions 31 shown in FIG. 2. Unit 52 exposes the negative-working resist 16 to a mask shaped as the spacer 41 of FIG. 2. Unit 52 either has sufficient intensity during exposure to fully photopolymerize the monomer of resist 16 in the exposed areas, thereby leaving no monomer after development, or alternatively full polymerization is achieved by a subsequent optional oven baking 54 where the negative resist is heated for between about 0.5 minute to about 5 minutes at a temperature of from about 75° C. to about 125° C. The blank 10 is then recoiled at 56, creating new stresses in the fully exposed portions of the negative-working resist due to the lack of monomer. Subsequently strip 56 is moved (56') to developing station B where a wash spray device 58 removes the exposed portions of positive resist 14, and cover sheet 18 if it is water soluble. Wash bath 59 rinses off residual developer. Alternatively, a mechanical stripper (not shown) can be used to remove sheet 18 if it is the laminated type. The strip now bearing the positive resist over the beam leads 36, fingers 32, and edge portions 31 only, of the metal layer, is carried to etch station C and passed through an etch bath 60 to etch the openings in layer 12 shown in FIG. 2. A wash bath 62 removes residual etchant. To develop the negative resist, the strip continues to station D where apparatus 64 sprays a suitable solvent such as 1,1,1-trichloroethane onto the strip to remove the unexposed areas of negative resist 16, leaving at each frame the spacer 41 as shown in FIG. 2. A rinse spray 66, usually water, is also included. This rinse spray can also be selected to remove the positive resist 14 remaining on the opposite side of the metal. The strip is recoiled at 68.

At bonding station E, the strip is uncoiled at 68', and IC chips 40 are mated with windows 42. Bonder 70 bonds the inner portions of the leads to the IC bumps, preferably at a temperature in excess of 400° C. It is this elevated temperature which creates objectionable outgassing and cracking of the spacer 41 if the formulation of resist 16 is not carefully controlled. The bonded strip is recoiled at 72.

To determine which, if any, of the components of the IC chip have not survived the processing and/or are defective, the strip is then uncoiled at 72', station F. To free the leads 36 from edge portions 31, a punch 73 is operated to sever the connections of outer portions 37 of the leads. The unit formed by the leads now connected just to the chip can be transferred to another conveyor path 74. An optional testing device 75 is disposed to check each of the leads by contacting outer portions 37 thereof. Spacer 41 continues to hold the leads in their proper orientation. Frames bearing inoperative IC chips are then removed (not shown) and operative units are carried to station G for final packaging. Other components (not shown) are fed into place at station G and the outer lead portions 37 are bonded and assembled with these components by conventional apparatus. If the chip is to constitute an individual component, it is hermetically sealed in an inert plastic envelope and the outer lead portions 37 are bonded to a circuit board. Alternatively the outer lead portions can be bonded along with the leads of diverse other chips to a thin film circuit to create a hybrid element.

It will be readily appreciated that one or more of the coiling and uncoiling steps can be eliminated to permit immediate application of the next step of the process. However, because steps D, E, and F can each proceed at a rate that is generally different from the other step rates, recoiling and subsequent uncoiling is as a practical matter necessary to some extent. It is this coiling and uncoiling that demands superior flexibility and adhesion of the negative resist spacer 41 to the beam leads. The removal of unpolymerized monomer at station A eliminates the plasticizing effect that would otherwise be present.

As an alternative to the aforedescribed process, exposure station A and developing station B can be used to process just the positive-working resist, in which case a separate exposure station for the negative-working resist would be inserted between station C and D.

As yet another alternative, the leads 36 can be etched free of edge portion 31 during the primary etching, station C. In that case, one or more mounting bridges (not shown) is used to connect spacer 41 to the metal edge portions 31 of frames 30, and the mechanical severance step at punch 73 is used just to sever the bridge.

EXAMPLES

The following examples further illustrate the nature of the invention.

EXAMPLE 1

Each of the following negative-resist formulations of Table I was coated at 75 microns dry thickness onto a 35 micron thick copper foil coated on one side with a 5 micron thick positive-working resist to form a continuous film strip. Recurring units are stated in mole percents. The positive-working resist comprises in each case the following composition:

| Composition of Positive-Working Resist | |
|---|---|
| Cresol-formaldehyde resin esterified with 6-diazo-5,6-dihydro-5-oxo-1-naphthalene sulfonyl chloride | 70.0 g |
| Poly(ethylacrylate-co-methacrylic acid) (90:10 mole ratio) 26.6% solids in butyl acetate solution | 112.8 g |
| Glacial acetic acid | 1.36 g |
| Butyl acetate | 99.2 g |

TABLE 1

| Compositions of Negative-Working Resists | |
|---|---|
| Example 1 | |
| Poly(methyl methacrylate-co-butylmethacrylate-co-acrylic acid) (34:63:3) available from Rohm and Haas under the trademark "Acryloid B48N" | 2.0 g |
| Poly(methylmethacrylate) available from Rohm & Haas under the trademark "Acryloid A-11" | 2.0 g |
| 1,6-Hexanediol diacrylate | 1.75 g |
| 4,4'-Bis(dimethylamino)benzophenone (MK) | 0.025 g |

TABLE 1-continued

Compositions of Negative-Working Resists

| | |
|---|---|
| Benzophenone | .15 g |
| 3-t-Butyl-4-hydroxy-5-methyl-phenyl sulfide (photoinhibitor) | 0.0175 g |
| Dichloromethane (DCM) | 8.92 g |
| Example 2 | |
| "Acryloid B48N" | 2.0 g |
| "Acryloid A-11" | 2.0 g |
| Pentaerythritol tetraacrylate | 0.75 g |
| Tripropylene glycol diacrylate | 1.0 g |
| MK | 0.025 g |
| Benzophenone | 0.15 g |
| 3-t-Butyl-4-hydroxy-5-methyl-phenyl sulfide | 0.0175 g |
| DCM | 8.92 g |
| Example 3 | |
| "Acryloid B48N" | 2.0 g |
| "Acryloid A-11" | 2.0 g |
| Tetraethylene glycol diacrylate | 1.27 g |
| 3,3'-carbonylbis(5,7-di-n-propoxycoumarin | .036 g |
| Ethyl-4-dimethylamino benzoate | .036 g |
| t-Butylpyrocatechol (photoinhibitor) | .0175 g |
| Dichloromethane | 8.16 g |

Two controls were prepared. For Control No. 1, a 100-micron thick layer of Riston "Solder Mask" Type 740S photoresist available from DuPont was laminated onto the copper foil in place of the negative-working resists of Examples 1–3. For Control No. 2, a 75-micron thick layer of "Riston I" resist available from DuPont was prepared by laminating together 3 layers of 25 microns each. The active components of the composition of the "Solder Mask" and "Riston I" resists are as follows:

| | Solder Mask | Riston I |
|---|---|---|
| Binder | poly(methyl methacrylate | poly(methyl methacrylate |
| Monomer | Pentaerythritol tetraacrylate | Trimethylol propane tri-acrylate |
| Photoinitiator | 4-chlorobenzo-phenone and Michler's ketone | Michler's ketone and Benzophenone |

Each sample was processed as follows:

(1) All sample strips were exposed until 13 solid steps were produced with a Kodak T-14 0.15 neutral density step tablet, on a Colight M-218 exposing unit (400 watt mercury lamp). In the case of Example 1, the amount of exposure was 4 minutes, for example.

(2) The strips were then baked in an oven at 90° C. for 1 minute.

(3) Exposed positive resist films were immersion developed for 90 seconds in aqueous-diluted KMPR-809 developer (1:1) available from Eastman Kodak, to completely remove the exposed areas. A final water rinse was used to remove all traces of developer.

(4) The unprotected copper foil (exposed areas) was chemically removed using a FeCl$_3$ spray etcher at 45° C. (2-minute total etch).

(5) The protective positive resist was then removed in a stripper of KMPR-809 developer and isopropanol.

(6) The exposed negative resist films were then spray developed with 1,1,1-trichloroethane to remove the unexposed areas. A final water rinse was used to remove all traces of developer.

(7) All processed tapes were thermal compression bonded to gold bumped IC chips using a Jade JEMS/LAB bonder. The bonding cycle was for 0.35 seconds at 438° C.

All three of Examples 1 through 3 demonstrated the formation from layer 16 of a spacer 41 that adhered well to the copper and demonstrated little tendency to crack or break when processed through step (7). In contrast, however, Control No. 2 cracked and broke to such an extent by the time step (3) was completed that further testing was impossible. Control No. 1 fared better, but exhibited a pronounced tendency to "pop off" the copper beam leads prior to the final chip bonding step, step (7), thereby demonstrating a lack of adhesion.

COMPARATIVE EXAMPLE

The following negative resist formulation was found to be unacceptable.

C.E. No. 1

The formulation of Example 1 was repeated, except that the composition of the negative resist was as follows:

| Component | Amount |
|---|---|
| Poly(methyl methacrylate-co-ethyl acrylate (60:40) available from Rohm and Haas Co. as "Acryloid B-82" | 1.0 g |
| Polymethylmethacrylate available from Rohm and Haas Co. as "Acryloid A-11" | 1.0 g |
| Pentaerythritol tetramethacrylate | 0.6 g |
| Pentaerythritol tetraacrylate | 0.45 g |
| Benzophenone | 0.23 g |
| Michler's Ketone [4,4'-Bis(dimethylamino) benzohenone] | 0.03 g |
| Dibutyl phthlate plasticizer | 0.21 g |
| Dichloromethane | 7.8 g |
| Non-ionic fluorochemical surfactant in ethyl acetate 50% active solids, available from 3M under the trade name "FC-431" | 0.02 g |

This resist was coated, exposed, developed and tested as described in Example 1. After the bonding step, step 7, it was found that the negative resist spacer 41 had cracked and separated enough from the copper fingers so as to render the results unacceptable. That is, insufficient dimensional stability was provided for the copper beam leads. It is believed this was due in part to insufficient adhesion of the resist binder to copper, as well as to the lack of flexibility in a binder containing only 40 mole percent of ethyl acrylate. Merely increasing the relative amount of the ethyl acrylate is not believed to be acceptable as this along with the corresponding decrease in methyl methacrylate produces an unacceptable lowering of the binder Tg.

The invention has been described in detail with particular reference to certain preferred embodiments thereof, but it will be understood that variations and modifications can be effected within the spirit and scope of the invention.

What is claimed is:

1. In a blank for manufacturing an integrated circuit component lead frame, said blank comprising
a flexible strip of electrically conductive metal,
a layer of positive-working resist adhered to a portion of one surface of said metal strip, and a layer of negative-working resist adhered to a portion of the opposite surface of said metal strip said negative-working layer having a thickness sufficient to support leads formed from said metal strip the improvement wherein said negative-working resist comprises a binder, a photopolymerizable monomer portion, and a photoinitiator composition said binder comprising a mixture of at least (i) a polymer having recurring units with the structure

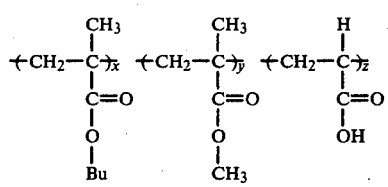

wherein each Bu is butyl, and x, y and z are mole percents and are about $30 \leq x \leq 70$ $30 \leq y \leq 60$ $1 \leq z \leq 5$;

and (ii) polymethylmethacrylate in an amount of from 0 to about 75 weight percent of the mixture; said binder having a glass transition temperature between about 50 and about 100° C.;

said monomer portion being a compound selected from the group consisting of triethylene glycol diacrylate, tetraethylene glycol diacrylate, and a mixture of pentaerthyritol tetraacrylate and either 1,6-hexanediol diacrylate or tripropylene glycol diacrylate.

2. A blank as defined in claim 1, wherein said monomer is tetraethylene glycol diacrylate.

3. A blank as defined in claims 1 or 2, wherein from 25 to 50% by weight of said binder comprises polymethyl methacrylate.

4. A blank as defined in claim 1, and further including a mechanically strippable cover sheet on said layer of negative-working resist.

5. A blank as defined in claim 1, wherein said photoinitiator composition comprises a mixture of an amine and a 3-ketocoumarin.

* * * * *